United States Patent [19]

Grobman et al.

[11] 4,405,238

[45] Sep. 20, 1983

[54] ALIGNMENT METHOD AND APPARATUS FOR X-RAY OR OPTICAL LITHOGRAPHY

[75] Inventors: Warren D. Grobman, Yorktown Heights; David A. Nelson, Jr., Carmel; John M. Warlaumont, Croton-on-Hudson, all of N.Y.

[73] Assignee: IBM Corporation, Armonk, N.Y.

[21] Appl. No.: 265,140

[22] Filed: May 20, 1981

[51] Int. Cl.³ .......................... G01B 9/02; G01B 11/00
[52] U.S. Cl. ................................... 356/401; 356/363; 356/375; 350/162.16
[58] Field of Search ............... 356/399, 400, 401, 356, 356/363, 373, 374, 375; 350/162.16, 162.20, 162.24; 250/237 G, 231 R, 231 SE

[56] References Cited

U.S. PATENT DOCUMENTS

4,037,969 7/1977 Feldman et al. ..................... 356/400
4,311,389 1/1982 Fay et al. ............................ 356/400

*Primary Examiner*—R. A. Rosenberger
*Attorney, Agent, or Firm*—Pollock, Vande Sande & Priddy

[57] ABSTRACT

Fine alignment of mask and wafer, using Fresnel zone plates is achieved. Light is focused on the wafer by a zone plate in the mask. Light diffracted from a zone plate on the wafer is received by a sensor. The received light is coded (analog or digital) to indicate alignment. For analog coding the wafer zone plate diffracts light to the sensor from an area of the wafer zone plate which is indicative of alignment. For digital coding, the wafer zone plate is digitally encoded as a function of alignment to similarly code the diffracted light. To eliminate ambiguity, the mask zone plate is formed from a plurality of "elements", each of which is itself a Fresnel zone plate. The focal length of the elemental Fresnel zone plate can be related to the mask/wafer separation distance, whereas the focal length of the macro zone plate (made up of a plurality of the elemental zone plates) is related to the distance between mask and light sensor.

15 Claims, 21 Drawing Figures

ALIGNMENT METHOD AND APPARATUS FOR X-RAY OR OPTICAL LITHOGRAPHY

FIELD OF THE INVENTION

The invention relates to a method and apparatus for aligning a first object with respect to a second object, which finds particular application in X-ray or optical lithography such as is typically employed in the manufacture of integrated circuits.

BACKGROUND OF THE INVENTION

The small feature size or line width, which is characteristic of integrated circuits has required the development of precise method and apparatus for aligning two objects with each other, for example, a mask and wafer. This development has led to the practice of a variety of alignment techniques, the variety of techniques is indicated by the fact that the various techniques employ optical energy or light, electron beams, and even X-rays for the illumination function. Typical of the prior art techniques are Smith et al, U.S. Pat. No. 3,742,229; Davis et al, U.S. Pat. No. 3,901,814; Michail et al, U.S. Pat. No. 3,900,736; Suzki, U.S. Pat. No. 4,167,677; O'-Keeffe et al, U.S. Pat. No. 3,840,749; Johannsmeier et al, U.S. Pat. No. 4,070,117 and U.S. Pat. No. 3,683,195; and Nakazawa et al, U.S. Pat. No. 4,103,998.

In order to realize the full potential of several very high resolution fabrication techniques it is essential to provide a method and apparatus for registering successive masks with a wafer with sufficient accuracy. For example, for sub-micron lithography (minimum feature size between 0.2 and 0.5 microns) it has been estimated that the required alignment accuracy is on the order of $\pm 0.5$ microns. In attempts to push alignment accuracy to this region, prior art workers have gone to the use of collective interference effects which take place between alignment marks exhibiting a grating structure. For example, one group of alignment techniques employ the Moire effect; in this regard see Reekstin et al, U.S. Pat. No. 4,193,687, "Uber Die Justierung Ebener Strukturen Mittels Moire" by Schwieder et al in *Optica*, Volume 23, pages 4961 (1976) and "Photolithographic Mask Alignment Using Moire Techniques" by King et al in *Applied Optics*, Volume 11, No. 11, pages 2455-2459 (November, 1972). The problem with Moire techniques in general is that while they appear to be capable of extending the accuracy of conventional optical methods, the difficulty lies in achieving sufficient contrast.

Also reported is an alignment method using identical gratings on mask and wafer, for example see Smith et al, U.S. Pat. No. 4,200,395.

Finally, very recently Fay et al reported in "Optical Alignment System for Sub-Micron X-ray Lithography", J. Vac. Sci. Technol., Volume 16, No. 6, pages 1954-1958 (November-December, 1979) an optical alignment method which embraces the concept of Fresnel zone lenses, optical scan and diffraction grating. The report claims extreme accuracy, better than $\pm 0.05$ microns, continuous alignment, gap monitoring and high signal to noise ratio. Another alignment technique employing Fresnel zone plates for focusing a light beam is described in Feldman et al, U.S. Pat. No. 4,037,969.

As described by Fay et al, their alignment technique proposes a Fresnel zone plate on one of the two elements to be aligned, and a reflective stripe, on the other element. For example, Fay et al propose the zone plate on the mask, and the stripe on the wafer. The zone plate has the property of focusing incident light, so that, for example, by adjusting the proximity gap (distance between wafer and mask) to be equal to the focal length of the zone plate light incident on the zone plate is focused on the wafer. The reflective stripe on the wafer has a reflection coefficient which is larger than its surroundings. In order to obtain good contrast; to reduce background and other unwanted interference effects, Fay et al propose making the reflecting stripe actually a grating so as to limit or eliminate the zero order reflection from the zone plate. Because the reflective stripe is essentially a grating the light reflected from the wafer mark is diffracted into many diffraction orders. A photodetector, which is used to detect reflected light, is located so as to collect the first or any higher diffraction order (practically, the first order is the best) and the detected signal will be completely free of zero order reflection. The first order diffraction signal then will produce a convolution signal with very low background when mask and wafer and relatively displaced. Fay et al employ a scanning mirror in the optical path between the source of light and the mask-wafer, so that by rotating the mirror the angle of incidence of radiation on the mask is varied which results in displacing the incident radiation on the wafer. This enables an error signal to be derived without required relative motion between mask and wafer, which error signal can be used to drive the relative displacement error between mask and wafer to zero.

In the experiment reported by Fay et al the scanning motion of the mirror resulted in motion at the wafer of about $\pm 1$ micron. Fay et al also suggests that the wafer grating (typically 1.5 microns in width) be alternated with a wider grating (10 microns in width) with different grating periods such that two alignment signals are returned in slightly different directions. While Fay et al suggests that the signal from the narrow lines could be used for fine alignment and the larger lines could be used for pre-alignment, it is not at all apparent what the form of the signal from the larger lines would be, or how that could be used in pre-alignment.

Thus, a difficulty with the Fay et al alignment technique is its limited range. While manual coarse alignment is certainly possible, we do not believe that manual alignment is capable of efficiently reducing the mask-wafer misalignment to the $\pm 1$ micron range of the Fay et al alignment technique.

It is therefore one object of the present invention to provide an improved alignment technique which is not limited in range as apparently Fay et al's technique is. It is another object of the present invention to provide an alignment apparatus, generally of the type described by Fay et al but in which the wafer mark has characteristics not described by Fay et al, so as to enable a substantially unlimited increase in automatic alignment range for the apparatus. It is another object of the present invention to provide an alignment system of the foregoing type which is capable of generating an error signal having any desired relation to misalignment. For example, in one embodiment of our invention the wafer mark is arranged such as to provide a linear relation between misalignment and resulting error signal; however, by varying the characteristics of the alignment mark on the wafer, it is also within the scope of our invention to provide a non-linear relation between error signal and misalignment, for example, an error signal with derivatives increasing with misalignment. While embodiments of our invention employ an alignment mark which is arranged to provide an error signal which is, in an analog sense, a measure of the misalignment, it is also within the scope of our invention to provide an alignment mark which is arranged to provide an error signal which is digitally encoded to represent misalignment. The alignment mark providing a digitally encoded error signal can, if desired, be arranged to provide, in addition to the digitally encoded error signal, an analog error signal which is a measure of the misalignment.

It is a further object of the invention to provide mask-wafer gratings to ensure unambiguous alignment as compared to ambiguous alignment which can result if a periodic Fresnel zone plate is employed. It is yet another object of the invention to maximize the useable diffracted light. Other objects of the invention will become apparent as this description proceeds.

SUMMARY OF THE INVENTION

The invention meets these and other objects by providing a method and apparatus for alignment of two objects movable relative to one another, for example, a mask and wafer, in which one of the objects (for example, the mask) includes a Fresnel zone plate for focussing incident radiation at predetermined focal length, and the other object (for example, the wafer) includes a grating structure, a source of radiation incident on the zone plate, and a light sensor aligned so as to receive light diffracted from said grating structure of a specified order, the grating structure arranged, so that when there is misalignment, the grating structure diffracts to the light sensor, light from only a portion of the length of a line image produced by the zone plate, the extent of the length of the line image diffracted to the light sensor varying as a function of misalignment.

Also, in accordance with the invention, a wafer carries an alignment mark thereon for use in an optical alignment system, the alignment mark comprising a pattern of edges in a surface of the wafer, said pattern of edges comprising a first plurality of substantially parallel edges spaced at a predetermined distance thereby defining a grating structure, and a second and third pluralities of edges lying on separate, converging curves. In a first embodiment, in accordance with the invention, the two converging curves defined by the second and third plurality of edges, are each converging lines; in another embodiment of the invention, each of the second and third plurality of edges are not linear, the curves may be convex or concave.

In accordance with still other embodiments of the invention the grating structure is generally characterized as triangular in plan view, however, the generally converging sides, in a plan view have discontinuities therein spaced from one another to provide, in the error signal produced by the light sensor, a digitally encoded signal word in which the digital code is representative of misalignment.

In some embodiments the wafer grating structure is generally triangular in plan view (without requiring linear sides) and includes discontinuities to digitally encode misalignment information. In other embodiments the wafer grating may be generally rectangular, in plan view, but include discontinuities to digitally encode misalignment information.

BRIEF DESCRIPTION OF THE DRAWINGS

The present invention will now be described in such further detail so as to enable those skilled in the art to make and use the same in the following portions of this specification when taken in conjunction with the attached drawings in which.

DETAILED DESCRIPTION OF PREFERRED EMBODIMENTS

Figure 1:
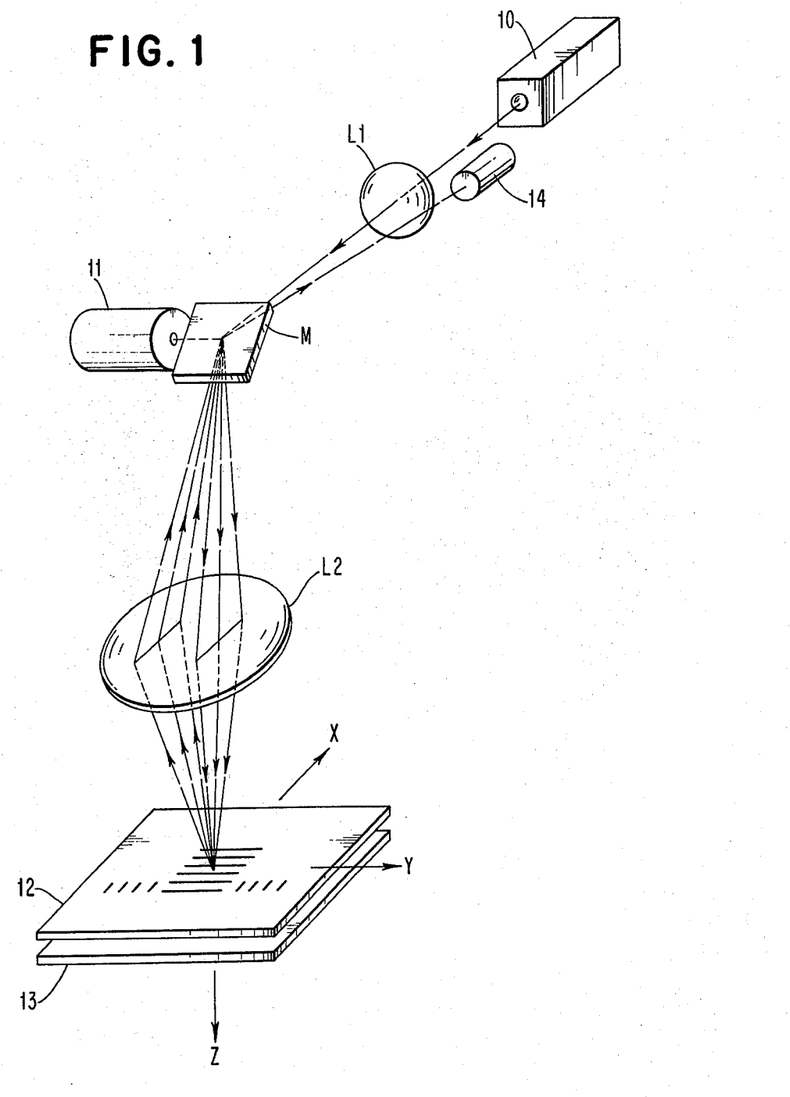
FIG. 1 is a block diagram of an alignment system illustrating the general arrangement of components as described by Fay et al.

Before describing, in detail, the specific form of the alignment marks for mask and wafer, reference is made to FIG. 1 which illustrates one arrangement in which the invention can be employed. As is shown in FIG. 1, a light source, illustrated as a laser 10 emits a beam of optical energy, which is focussed by lens L1 onto a mirror M which can be rotated by a scanner 11. Lens L2 is arranged so that light from a point on the mirror M is imaged on the mask 12. By varying the angle of the mirror M, the angle of incidence of the light beam on the mask 12 can be varied. The light incident from lens L2 on the mask 12 is incident on a Fresnel zone plate with focal length equal to the distance (f) between the mask and wafer. As a result, the light incident on the Fresnel zone plate, of mask 12, will be focussed on the wafer 13. By varying the angle of incidence of the light on the mask 12, the location of the focussed line image on the wafer 13 can be varied. If one measures the angle alpha, between a normal to the mask 12 and the angle of incidence of the light beam, then the displacement in the wafer plane is approximately f tan alpha. The returned signal, that is the light reflected by the grating mark on the wafer 13 is shifted laterally due to diffraction, collected by the lens L2 and emerges as a shifted parallel beam beyond lens L1, where suitably placed photo diode 14 is located. Phase locked detection techniques can then be used to generate an error signal with high S/N ratio. FIG. 1 is taken from the Fay et al report and his arrangement of a light source, lenses, mirror, mask wafer and photo diode can be employed in our invention. We prefer, however, to locate both lenses L1 and L2 on the mask side of the mirror M; retaining, however, an afocal system so that the returned diffracted light exits from the mirror M as a parallel beam and can therefor be detected by a suitably located light detector, such as the photo diode 14.

The invention is more particularly directed at generating an error signal whose shape, with respect to misalignment is more suitable for rapid automatic alignment, than is the arrangement reported by Fay et al. Desirably, the error signal is present over much larger distances than is the Fay et al error signal, and some embodiments of the invention provide an error signal with one or more desirable characteristics; another feature is digitally encoding misalignment distance at selected stages of misalignment; for example, the latter feature enables a higher slewing rate to be used with large misalignment, which then can be automatically reduced to slow slew rate as misalignment is reduced.

Figure 2A:
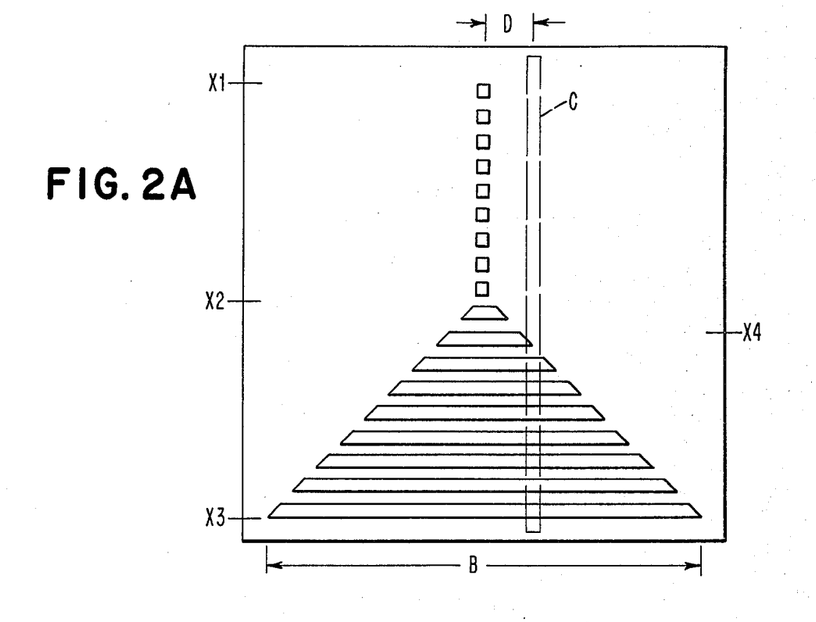
FIG. 2A is a plan view of a wafer grating mark in accordance with the invention.

FIG. 2A illustrates a wafer alignment mark in accordance with the present invention.

Figure 2B:
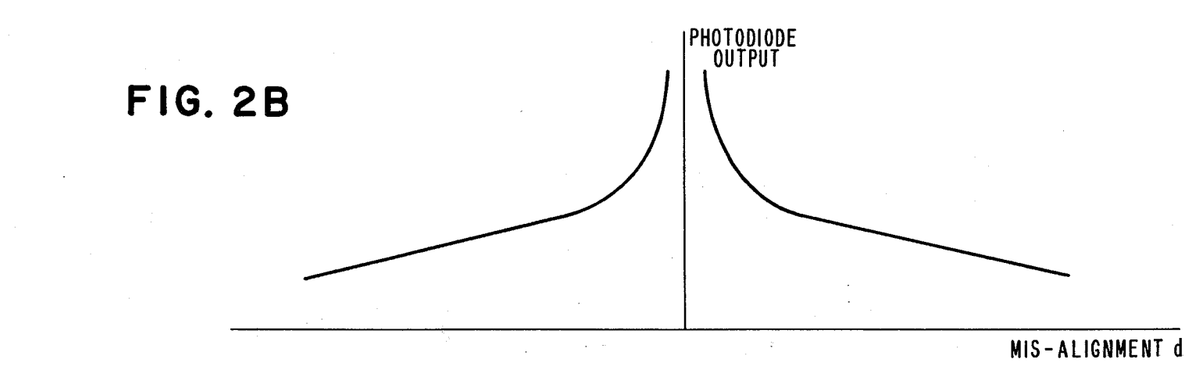
FIGS. 2B and 2C illustrate photo diode and error signal output as a function of a misalignment distance for the grating of FIG. 2A.
Figure 2C:
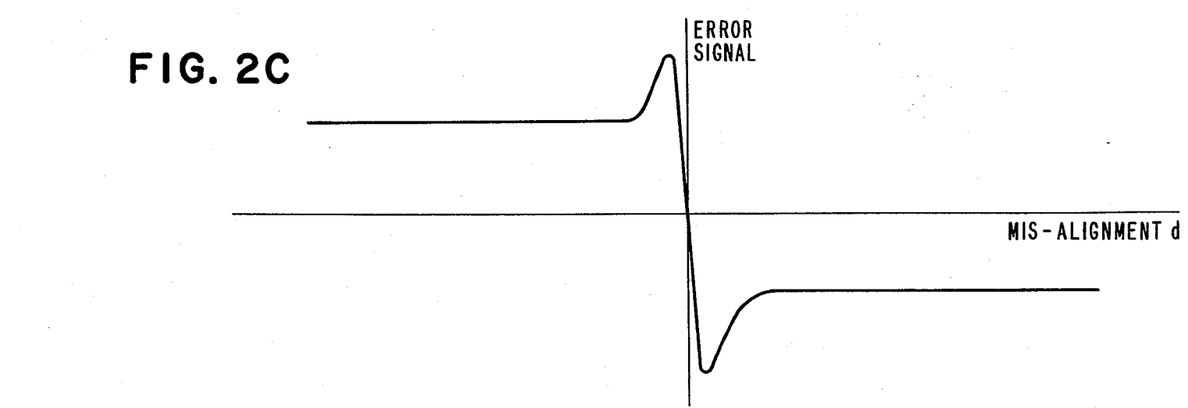

As shown in FIG. 2A the alignment mark on the wafer consists of a grating formed by any conventional technique, such as etching, consisting of, in a plan view, a first generally longitudinal grating extending from X1 to X2, and a second generally triangular grating extending from X2 to X3. A Fresnel zone plate, located on a mask, for use in conjunction with a wafer alignment mark as shown in FIG. 2A, may consist of a linear zone plate laying down a line image shown in dotted outline, for example, at C. Those skilled in the art will perceive that the wafer alignment mark, extending between X1 and X2 is entirely similar to the alignment mark suggested by Fay et al, and on the other hand the wafer alignment mark shown in FIG. 2 extending between X2 and X3 is quite different from the alignment mark suggested in Fay et al. More particularly, as illustrated in FIG. 2A, the line image C between X1 and X4 does not impinge at all on the wafer grating mark whereas the portion of the line image C extending between X3 and X4 does impinge on the wafer grating mark. This latter portion of the wafer alignment mark therefore returns a signal via the lenses and mirror to the detecting photo diode. It should be appreciated that, as the distance D between the centerline of the wafer alignment mark and the centerline of the line image C is varied, so will the amount of light diffracted by the wafer alignment mark to the detecting photo diode vary. Accordingly, so long as the line image C is located somewhere within the confines of the grating mark (that is, within the dimension B) light will be diffracted into the detecting photo diode. As a result, the active tracking distance over which an alignment system, employing the wafer alignment mark as shown in FIG. 2A can be used, is determined by the extent of the dimension B. It should also be apparent that the dimension B can be varied almost at will, the only price paid for extending the dimension B, is the wafer area consumed by the alignment mark. FIG. 2B illustrates the form of the photo diode signal with respect to misalignment D. It will be seen that a misalignment signal of some positive slope, exists over the entire length of the dimension B. Accordingly, the length of the dimension B determines the length over which automatic alignment using the wafer alignment mark of FIG. 2A can be obtained. It should also be appreciated, that the use of the wafer alignment shown in FIG. 2A eliminates the necessity of rocking the mirror M in order to generate an error signal for use by an automatic alignment apparatus. That is, once the line image C impinges on the wafer alignment mark some recognizable signal is produced by the photo diode 14, and by merely monitoring whether or not that signal is increasing or decreasing, the appropriate direction of slewing is determined for achieving alignment. On the other hand, of course, if rocking motion is employed, then the polarity of the output of the photo diode, analyzed in relation to the rocking phase readily determines the appropriate slewing direction to achieve alignment. FIG. 2C illustrates the derivative of the curve of FIG. 2B with respect to misalignment distance D which represents a phase detected error signal. This illustrates that the polarity of the detector output, when the incident beam is rocked, determines the appropriate slewing direction to achieve alignment.

It will be recognized that the wafer alignment mark shown in FIG. 2A is composed of a grating having a plurality of edges, a first plurality of edges which are all parallel to one another (and parallel to the length of the dimension B), and second and third pluralities of edges which lie on a generally converging curve. In the particular embodiment of the invention shown in FIG. 2A, those generally converging curves are each linear.

Figure 3A:
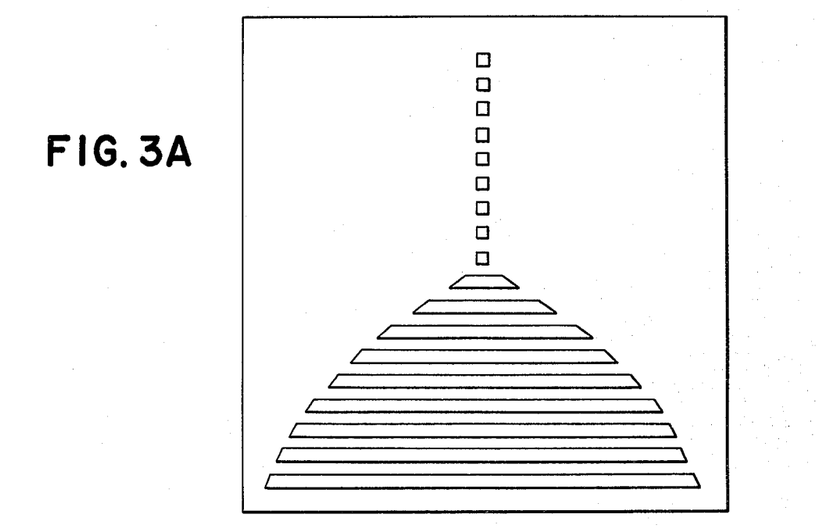
FIG. 3A is a plan view of a different wafer grating mark in accordance with the invention and FIGS. 3B and 3C plot photo diode and error signal output as a function of misalignment distance.
Figure 3B:
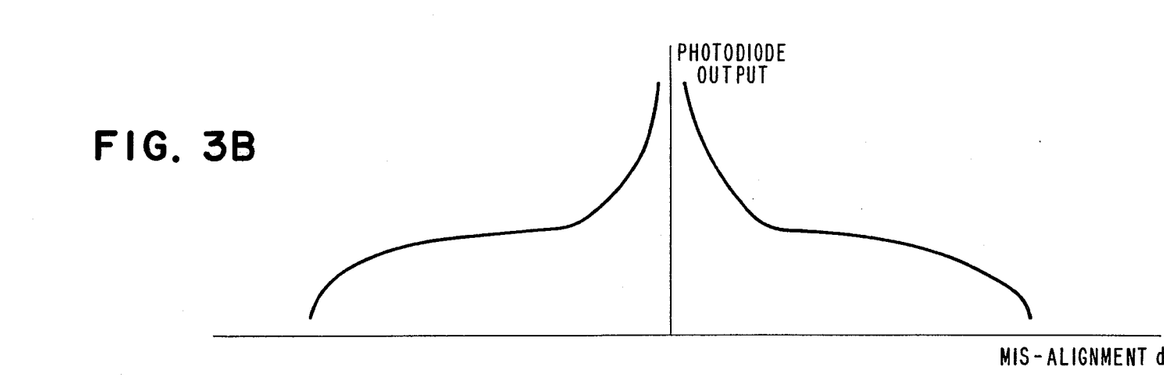
Figure 3C:
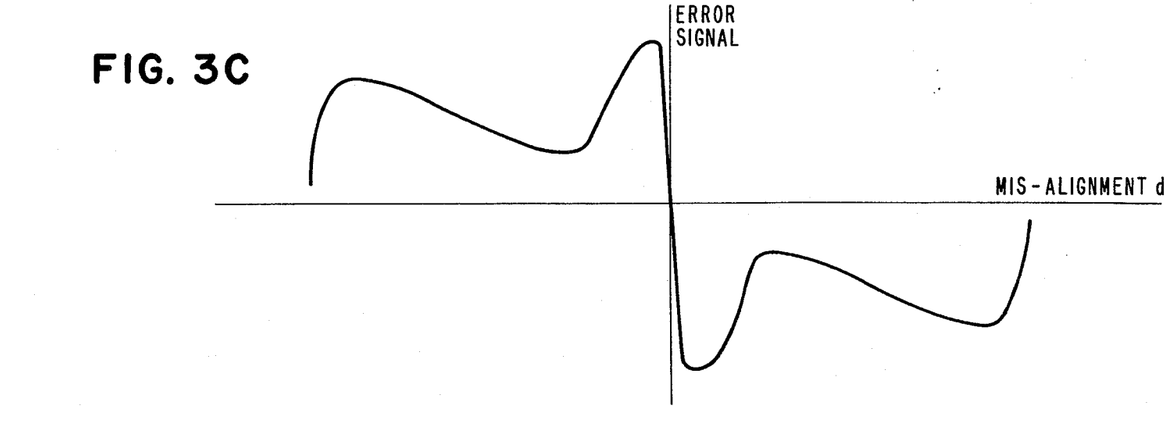

In another embodiment of the invention the wafer alignment mark is shown in plan view in FIG. 3A. FIG. 3A shows a wafer alignment mark which in many respects is similar to the alignment mark shown in FIG. 2A. That is, more particularly, the wafer alignment mark comprises a grating including a plurality of edges, a first plurality of edges which are generally parallel to one another, and second and third pluralities of edges which each lie on generally converging curves. However, in contrast to FIG. 2A, the wafer alignment mark shown in FIG. 3A, has generally converging curves which are non-linear, and more particularly have a slope which is generally proportional to misalignment distance. Use of the alignment mark shown in plan view, in FIG. 3A results in a photo diode detector output varying with misalignment distance D as shown in FIG. 3B. In addition, the rate of change of photo detector output with respect to misalignment D is shown in FIG. 3C which again represents a phase detected error signal. Use of the wafer alignment pattern shown in FIG. 3A has encoded misalignment distance in the waveform of FIG. 3C; this is advantageous in that now the error signal can be used to control the slewing speed of the servo system, so that the servo system can slew rapidly through areas of relatively large misalignment, automatically slowing for fine alignment.

Figure 3D:
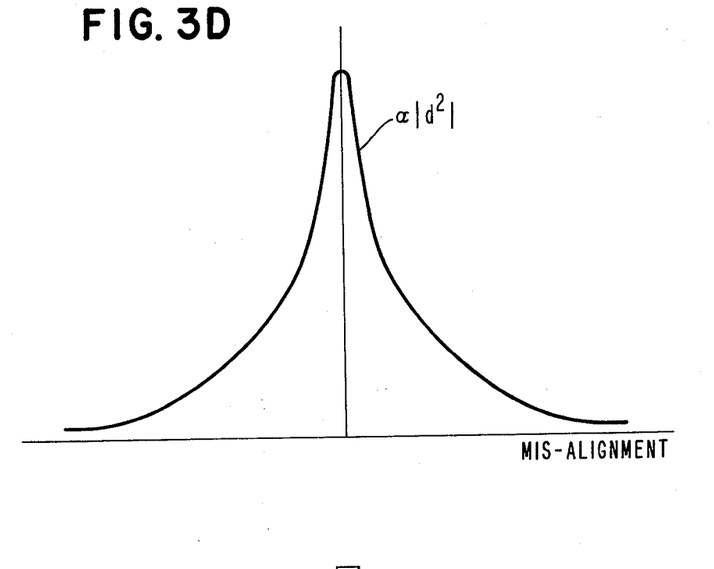
FIG. 3D is a plot of photo diode output.
Figure 3E:
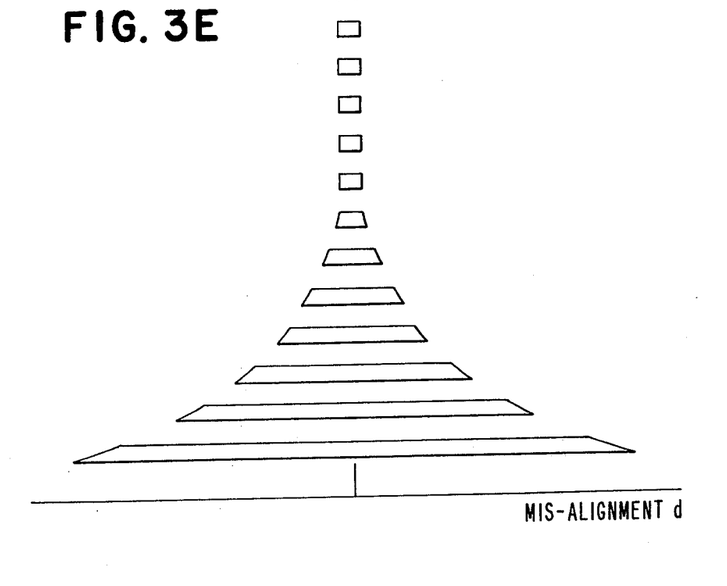
FIG. 3E is a plan view of still another wafer grating in accordance with the invention producing the photo diode output of FIG. 3D.
Figure 3F:
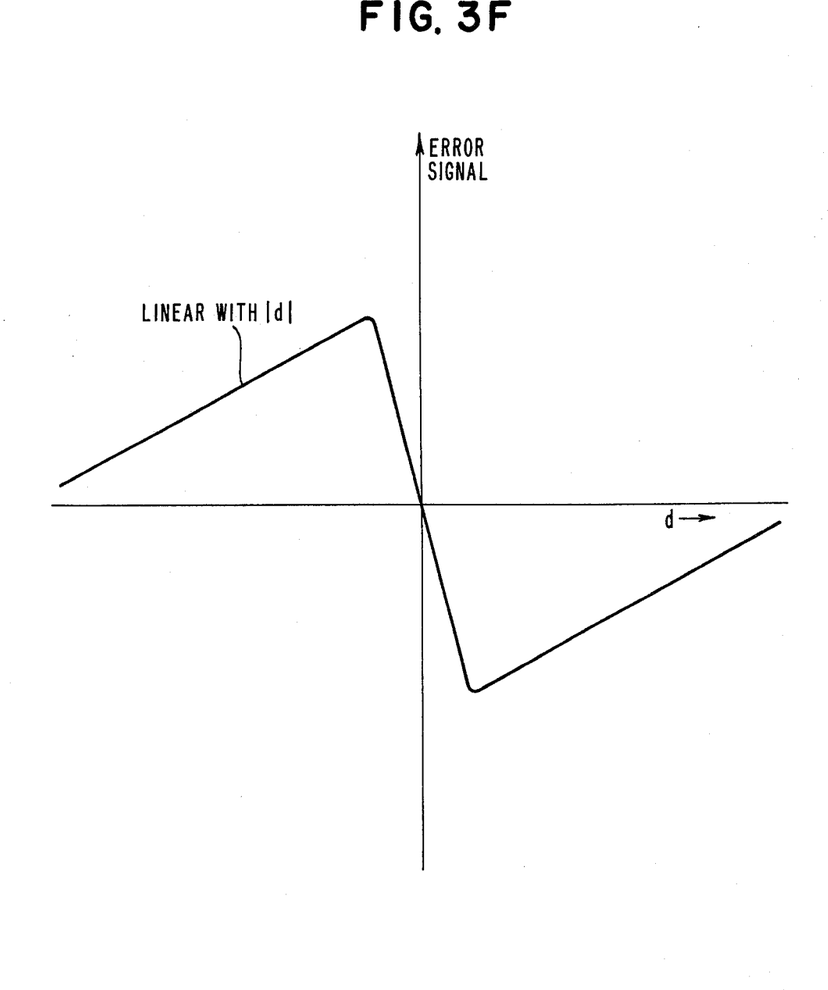
FIG. 3F is a plot of error signal output versus misalignment distance for the wafer grating of FIG. 3E.

In a further embodiment of the invention the wafer alignment mark takes on the form of FIGS. 3D and 3E. FIG. 3D shows the outline of the mark particularly illustrating its relation to misalignment, which is quadratic. FIG. 3F shows the mark itself, and whereas the mark of FIG. 3A has a concave curve (in outline) the mark of FIG. 3E is convex. Furthermore, the quadratic relation between mark outline and misalignment distance results in a servo circuit (driven by the photo diode) error signal as shown in FIG. 3F. The error signal shown in FIG. 3F is linear with misalignment; accordingly, not only is the slewing direction information included in a servo circuit error voltage but distance to alignment is also presented. The error voltage of FIG. 3F is again a phase detected signal.

FIGS. 2A and 3A illustrate an example of wafer alignment patterns for generating error signals or derivatives thereof which represent misalignment or distance from alignment. Those skilled in the art of electronic signal processing readily understand how these signals can be used to automatically drive a servo motor, or other similar transducer to effect automatic alignment.

Figure 4A:
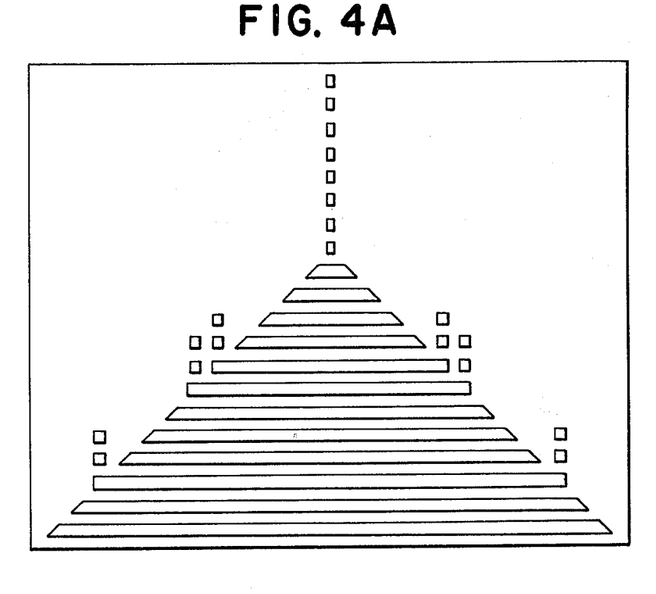
FIGS. 4A–4D are plan view of still other wafer gratings in accordance with the invention which incorporate digitally encoded misalignment information.

However, the invention is not at all restricted to the use of an alignment mark for generating such signals. In addition to generating signals, or their derivatives, which can be used to automatically drive analog type electronic positioning equipment the invention also comprehends the use of alignment marks which represent digitally encoded information as to misalignment or distance to perfect alignment. FIGS. 4A through 4D comprise plan views of wafer alignment marks having this characteristic. For example, FIG. 4A shows a plan view of a wafer alignment mark which, in many respects, is similar to the alignment mark shown in FIG. 2A. However, in addition to the alignment mark of FIG. 2A, FIG. 4A includes one or more discontinuities to digitally encode information as to quantum of misalignment or distance to alignment. Thus, for example, the grating pattern shown in plan view in FIG. 4A generates one or two pulses, in the photo diode signal, indicative of degree of misalignment. The coding scheme used for the alignment mark shown in plan view in FIG. 4A generates a signal pulse to indicate a region of relatively large misalignment, and generates a pair of pulses to indicate a region of smaller misalignment. Using conventional electronic circuits, or a microprocessor, or other random digital logic the pulse-like output of the photo diode can be isolated and analyzed to determine quantum of misalignment. The information derived therefrom can be used to automatically control the slewing speed of a servo motor or other transducer. For example, in such a system as soon as a response from the photo diode is detected, relatively slow slewing is implemented. The appropriate direction of slewing can be readily determined from the derivative of the photo diode output, i.e., the absolute value of the derivative should be increasing to indicate slewing toward alignment. This slow slewing is continued until one of the digital signals is encountered, if a two pulse-like signal is encountered, slow slewing is continued, since that information represents a region of relatively small misalignment. On the other hand, if a single pulse-like signal is recognized the slewing speed can be increased, and maintained at a relatively high speed until the two pulse-like signal is encountered, which then generates a change back to the slow slewing speed. Of course the coding scheme shown in FIG. 4A is not at all essential to the invention and, the digital encoding can directly represent degree of misalignment. That is, in this alternative, relatively large misalignment is represented by a pair of pulse-like signals, and a single pulse-like signal represents smaller misalignment. In addition, those skilled in the art will readily understand that more than two different digital signals can be employed depending upon various factors including slewing speed and the extent of the region of automatic alignment, that is the length of the parameter B.

Figure 4B:
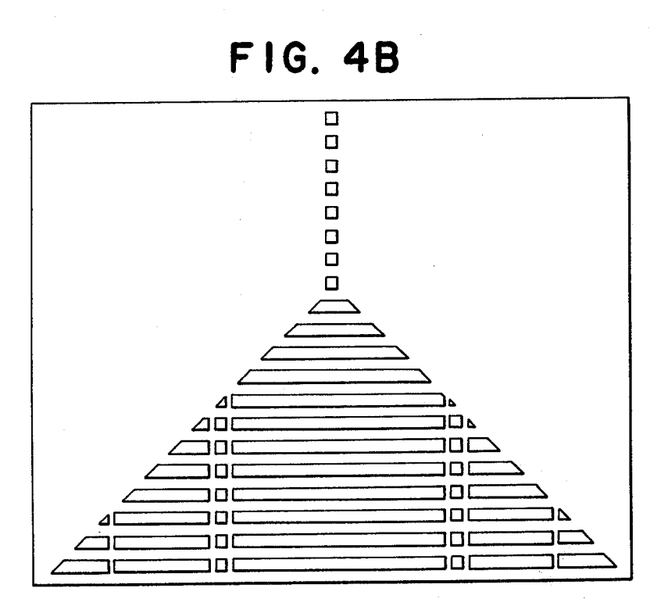

FIG. 4B illustrates still another wafer alignment pattern which includes the feature of digital encoding, but in a slightly different fashion. As shown in FIG. 4B, the wafer alignment pattern, which in many respects is similar to that shown in FIG. 2A, has portions (i.e., discontinuities) of the grating removed in a direction perpendicular to the longitudinal extent of the light image C. In the use of the alignment mark shown in FIG. 4B, the photo diode signal also includes pulse type encoding, but rather than superposing pulse signals on the analog signal as is the case with the alignment mark of FIG. 4A, in the case of the alignment mark shown in FIG. 4B, the analog signal intermittently drops out, each dropout representing a single pulse. Thus, the alignment marks of FIGS. 4A and 4B illustrate digital encoding using the same code but representing that code in the electrical signal, in a different fashion. Whereas the alignment mark of FIG. 4A places a pulse on the analog signal, the alignment mark of FIG. 4B results in a dropout of the analog signal corresponding to each pulse. The same or similar electronic circuitry or microprocessor or other random logic technology can be employed to detect the presence of the pulses generated by the alignment mark of FIG. 4B, for similar purposes.

Figure 4C:
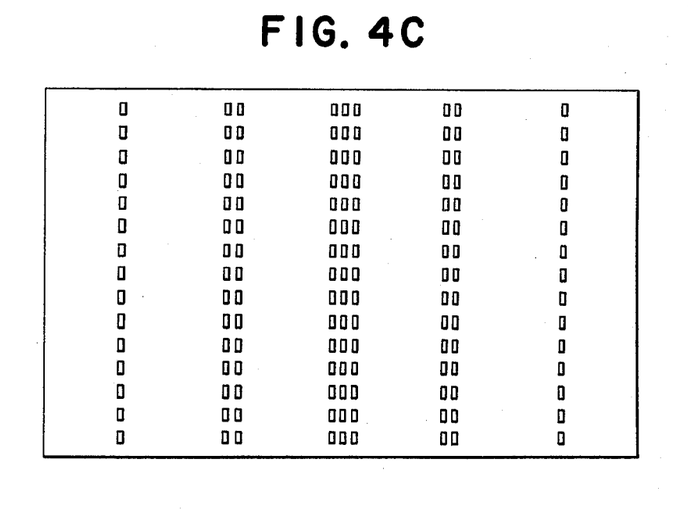

The digital encoding and the alignment marks of FIGS. 4A and 4B have been used in a single alignment mark to generate in the photo diode, a composite signal comprising the superposition of an analog and digital signal. That is not at all essential to the invention and, rather an alignment mark shown in FIG. 4C can be used to generate only digital signals. Since the alignment mark of FIG. 4C provides information to the photo diode only when the light image C crosses one of the alignment marks no information is provided to an automatic alignment system when the light image C is in a region between or outside of the alignment mark. For this reason, preferably the alignment mark whose plan view is shown in FIG. 4C is used in conjunction with an alignment mark as shown, for example, in FIGS. 2A or 3A, that is, more particularly, the wafer includes two alignment marks, one digitally encoded and the other encoded in analog fashion, and cooperating with each alignment mark is a different Fresnel zone plate for focussing incident illumination thereon or a single broad zone plate for imaging both marks. As shown in FIG. 4C the alignment mark comprises a plurality of gratings, taken in groups, and the number of gratings in each group provides information as to misalignment. Thus, for example, a single grating indicates relatively large misalignment, a pair of gratings indicates relatively less misalignment and three gratings in a group indicates a minimum misalignment. As in the case of the encoding used in the alignment patterns of FIGS. 4A and 4B, rather than encoding in this fashion, it is also possible to encode the digital information to indicate directly misalignment wherein, for example, the single alignment mark indicates alignment, a pair of gratings in a group indicates larger misalignment, and additional gratings in a group indicate still larger misalignment. In addition, whereas the alignment pattern of FIG. 4C produces a pulse-like signal in the photo diode as the light image C crosses each grating, the inverse of such a grating could be employed which is shown, for example, in FIG. 4D.

Figure 4D:
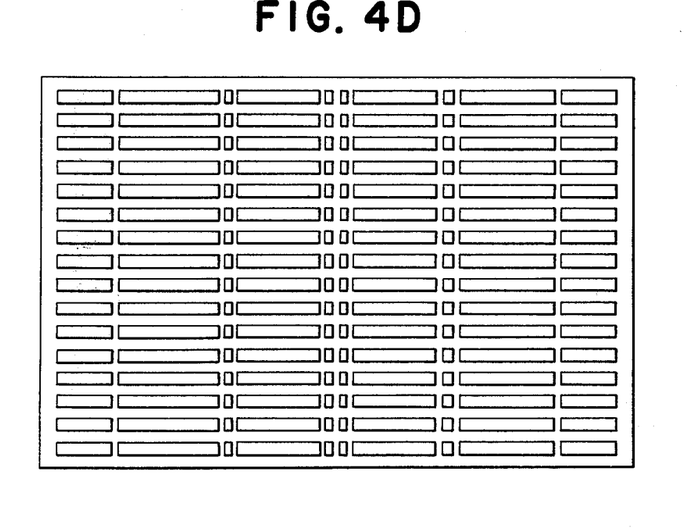

FIG. 4D uses the same type of coding as is shown in FIG. 4C, however, rather than using one, two, three or more gratings per group to produce one, two, three or more pulses representing misalignment, the alignment pattern shown in FIG. 4D normally produces a relatively high signal from the photo diode, and that signal drops out to generate the pulse-like signals indicative of misalignment.

Accordingly, the preceding discussion has described a number of different alignment marks for use with a Fresnel zone plate, light source and photo detector for rapid and precise alignment of a wafer and mask. Up to this point the description of the use of one or more Fresnel zone plates and associated wafer alignment marks provides for alignment in a single dimension or direction only. That is, the apparatus heretofore described is sufficient to align mask and wafer in the direction perpendicular to the longitudinal extent of light image C. Alignment in other directions requires additional Fresnel zone plates and associated wafer alignments, in a manner well known to those skilled in the art.

It should be apparent from the foregoing that in some cases it may be desirable to lay down Fresnel zone plates and wafer alignment marks whose width (that is a dimension generally perpendicular to the longitudinal extent of a light image C) is substantial, especially when considered in relation to the desired alignment accuracy of ±0.05 microns. In this connection it is noted that Fay et al indicates that in order to increase the signal level the alignment mark used in their experimental investigation comprised a matrix of individual Fresnel zone plates covering the area of 1 square millimeter, and the corresponding wafer alignment mark is also a mark of gratings (presumably also approximately 1 square millimeter in extent).

We have found that there are two problems with a periodic Fresnel zone plate which can be overcome by suitably changing the mask configuration.

Firstly, light returned from wafer to mask is diffracted by the periodic zone plate into many diffraction orders which are not directed to nor collected by the photo diode. This uncollected light represents a decrease in efficiency of the alignment system. Furthermore, a periodic mask zone plate results in a measuring ambiguity at a distance equal to the period. For example, a periodic zone plate with period of 100 microns will produce exactly identical signals at proper alignment and when misalignment is 100 microns.

Figure 5A:
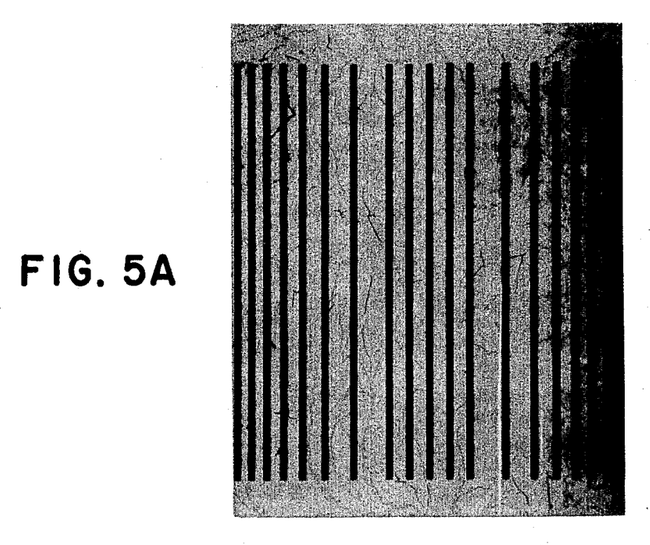
FIGS. 5A and 5B show the macro Fresnel zone plate and its elemental components, respectively.

To overcome both problems we fashion the mask zone plate from a plurality of "elements" each of which is a Fresnel zone plate with focal length nominally equal to desired mask-wafer separation distance (for example, on the order of several microns). This ensures that radiation incident on the mask zone plate is focused on the wafer. At the same time, however, each "element" is located to form a larger or macro Fresnel zone plate which has a different focal length. Referring briefly to FIG. 1 it will be seen that whereas the separation distance between mask 12 and wafer 13 is relatively small, the optical distance between mask 12 and photo diode 14 is much larger (measured, for example, in centimeters). Accordingly, the focal length of the macro Fresnel zone plate is made to equal the optical distance between mask 12 and photo diode 14. This gives another advantage; since the macro Fresnel zone plate is not longer periodic the alignment ambiguity is absent; there is one unambiguous alignment position. FIG. 5A shows the macro Fresnel lines as comprising a series of elements "E" at about 40× actual size, which was 4 mm². In FIG. 5A dark regions are opaque.

Figure 5B:
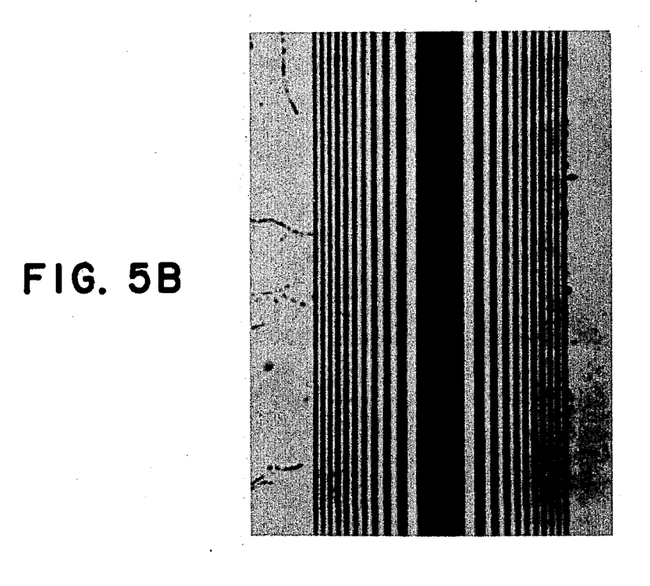

Each element E of FIG. 5A is shown, in detail in FIG. 5B, magnified 1600X. Thus, the spacing and width of each elemental transparent zone T (in FIG. 5B) is adjusted to focus the incident radiation in a distance nominally equal to mask-wafer separation. On the other hand, the spacing of the elements "E" results in a different focal length (in one example 10 cm.) selected to match mask to photo diode optical distance.

Figure 6A:
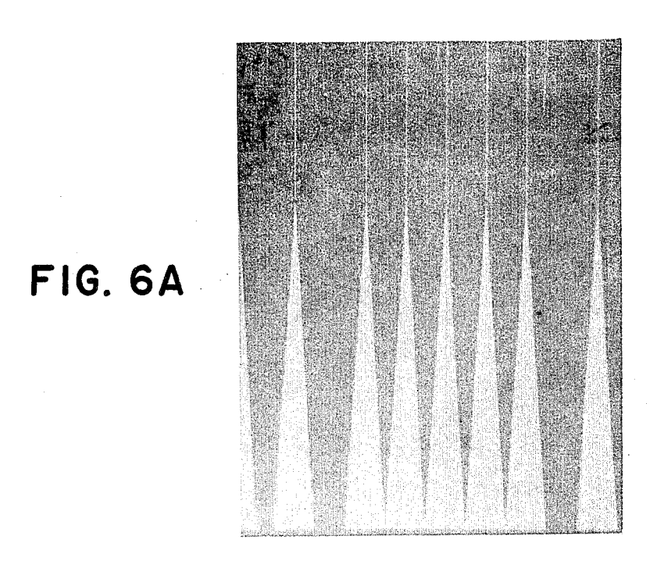
FIGS. 6A–6C illustrate a typical wafer grating for use with a macro Fresnel zone plate.
Figure 6B:
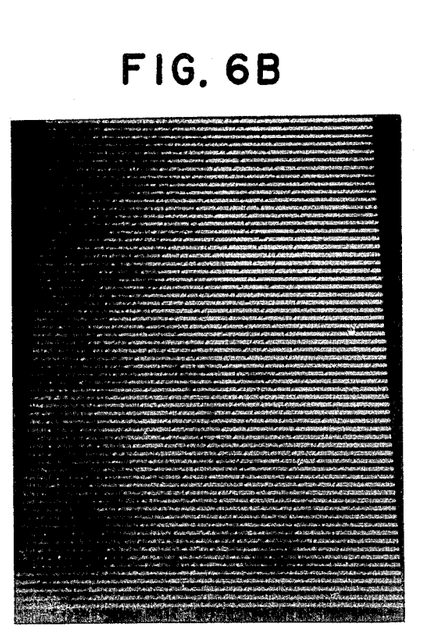
Figure 6C:
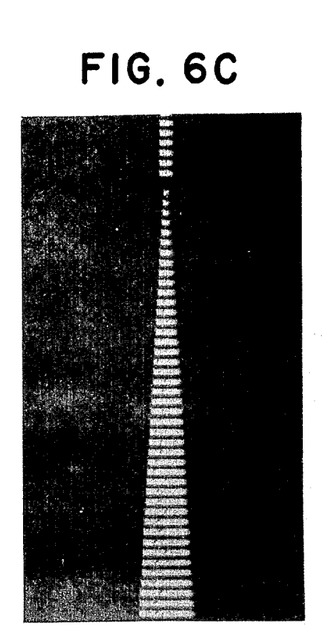

With the mask macro Fresnel zone plate covering a relatively large area (e.g. 1 mm²) the wafer alignment mark can be sized accordingly. FIGS. 6A-6C illustrate a wafer alignment mark comprising plural marks each of a shape in accordance with FIG. 2A. FIG. 6A shows the alignment mark (magnification 80), FIG. 6B shows the base of one element (magnification 800) and FIG. 6C shows the apex and its intersection with the rectangular grating (magnification 1000). FIG. 6A illustrates that the quantum of useable diffracted has been multiplied by covering a large area with repeats of an elemental wafer grating pattern.

Figure 7A:
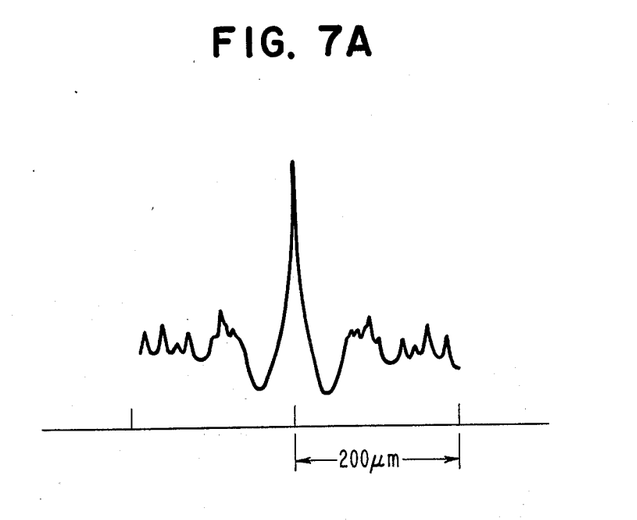
FIGS. 7A and 7B show photo diode output vs. misalignment for macro Fresnel zone plate and periodic Fresnel zone plate, respectively.
Figure 7B:
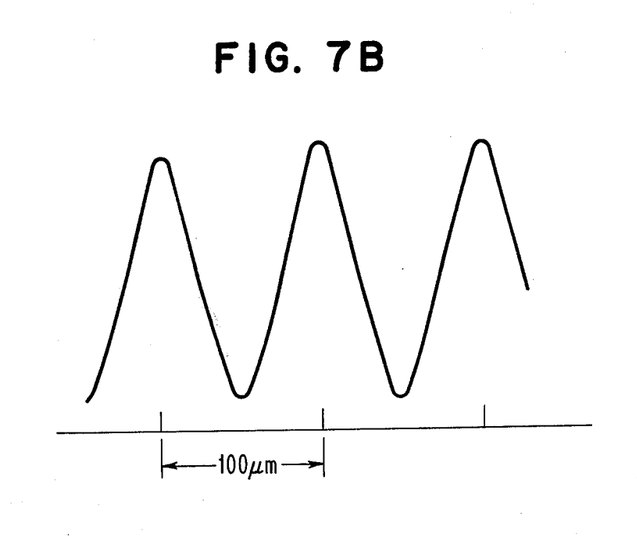

FIGS. 7A and 7B illustrate the advantage of the aperiodic macro Fresnel zone plate in eliminating alignment ambiguity. FIG. 7B is a trace of expected detector signal vs. misalignment for aperiodic Fresnel zone plate of 100 micron period. Note the alignment ambiguity of ±50 microns. On the other hand, FIG. 7A is a photo diode signal vs. misalignment (±200 microns) with a macro Fresnel zone plate. Clearly, misalignment ambiguity has been eliminated.

Having thus described our invention, what we claim as new, and desired to secure by Letters Patent is:

1. An alignment system wherein a first element to be aligned carries a Fresnel lens for focusing incident light to line image on a grating mark carried by a second element to be aligned therewith, the grating mark diffracting line image light to a light sensor, said Fresnel lens comprising a plurality of Fresnel zone plates, each said Fresnel zone plate with a common focal length $f_1$ and in which said plurality of Fresnel zone plates is arranged as a macro Fresnel zone plate with a focal length $f_2$, wherein $f_2$ is not equal to $f_1$.

2. A system of claim 1 in which said grating mark is shaped so that when there is misalignment, the grating mark diffracts to the light sensor light from one a portion of the length of the line image, the size of the length portion of a line image diffracted to the light sensor varying as a function of alignment position.

3. A system of claim 2 wherein $f_2$ is greater than $f_1$.

4. A system of claim 3 in which said Fresnel zone plates are linear Fresnel zone plates.

5. A system of claim 2 in which $f_2$ is on the order of a centimeter or more.

6. The system of claim 5 in which said Fresnel zone plates are linear Fresnel zone plates.

7. A system of claim 1 wherein $f_2$ is greater than $f_1$.

8. A system of claim 7 in which said Fresnel zone plates are linear Fresnel zone plates.

9. A system of claim 1 in which $f_2$ is on the order of a centimeter or more.

10. The system of claim 9 in which said Fresnel zone plates are linear Fresnel zone plates.

11. The system of claim 1 in which $f_1$ is related to nominal spacing between said first and second elements and $f_2$ is related to a light path from said first element to said light sensor.

12. In an alignment system, for aligning a first element carrying a first alignment mark with a second element carrying a second alignment mark, characterized in that said first alignment mark comprises a Fresnel lens comprising a plurality of Fresnel zone plates, each of said plurality with a common focal length $f_1$ and in which said plurality of Fresnel zone plates is arranged as a macro-Fresnel zone plate with a focal length $f_2$, wherein $f_2$ is not equal to $f_1$.

13. The apparatus of claim 12 wherein $f_2$ is greater than $f_1$.

14. The apparatus of claim 12 in which $f_2$ is on the order of a centimeter or more.

15. The apparatus of claim 12 in which $f_1$ is related to nominal spacing between said first and second elements and $f_2$ is related to a light path from said first element to said light sensor.

* * * * *

UNITED STATES PATENT AND TRADEMARK OFFICE
CERTIFICATE OF CORRECTION

PATENT NO. : 4,405,238
DATED : September 20, 1983
INVENTOR(S) : Grobman et al

It is certified that error appears in the above-identified patent and that said Letters Patent are hereby corrected as shown below:

Col. 9, line 17, change "mark" (second occurrence) to -matrix-.

Col. 9, line 49, change "not" to -no-.

Col. 10, line 16, change "desired" to -desire-.

Col. 10, line 29 (claim 2, line 3), change "one" to -only-.

Signed and Sealed this

Twenty-eighth Day of February 1984

[SEAL]

Attest:

GERALD J. MOSSINGHOFF

Attesting Officer  Commissioner of Patents and Trademarks